(12) United States Patent
Yu et al.

(10) Patent No.: US 10,826,269 B2
(45) Date of Patent: Nov. 3, 2020

(54) MULTI-PULSE GENERATION FOR PULSED LASER DIODES USING LOW-SIDE DRIVERS

(71) Applicant: DiDi Research America, LLC, Mountain View, CA (US)

(72) Inventors: Yibo Yu, Mountain View, CA (US); Yue Lu, Los Gatos, CA (US); Vipul Chawla, Mountain View, CA (US); Zhenghan Zhu, Mountain View, CA (US); Lingkai Kong, Palo Alto, CA (US)

(73) Assignee: BEIJING VOYAGER TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 16/377,203

(22) Filed: Apr. 6, 2019

(65) Prior Publication Data
US 2020/0203923 A1 Jun. 25, 2020

Related U.S. Application Data

(63) Continuation-in-part of application No. 16/231,823, filed on Dec. 24, 2018.

(51) Int. Cl.
*H01S 5/042* (2006.01)
*G01S 7/484* (2006.01)

(52) U.S. Cl.
CPC .......... *H01S 5/0428* (2013.01); *G01S 7/484* (2013.01)

(58) Field of Classification Search
CPC ...... H01S 5/042; H01S 5/0428; H01S 5/0261; G01S 7/484
See application file for complete search history.

(56) References Cited

U.S. PATENT DOCUMENTS

2019/0229493 A1* 7/2019 Stern .............. H01S 5/0428

* cited by examiner

*Primary Examiner* — Armando Rodriguez
(74) *Attorney, Agent, or Firm* — Bayes PLLC

(57) ABSTRACT

A system for controlling a pulsed laser diode includes a power source configured to supply power to the pulsed laser diode and at least one driving branch between the power source and the pulsed laser diode. The at least one driving branch is configured to control power delivery from the power source to the pulsed laser diode. The at least one driving branch is connected to a cathode of the pulsed laser diode.

17 Claims, 7 Drawing Sheets

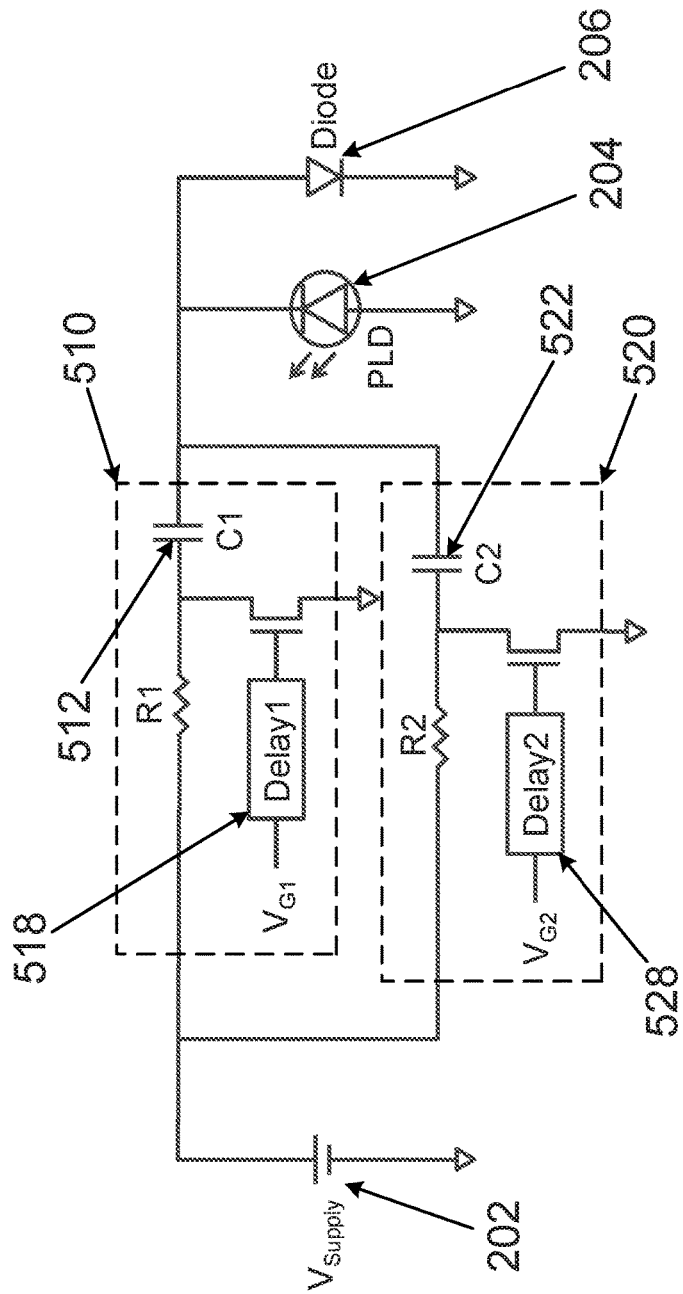
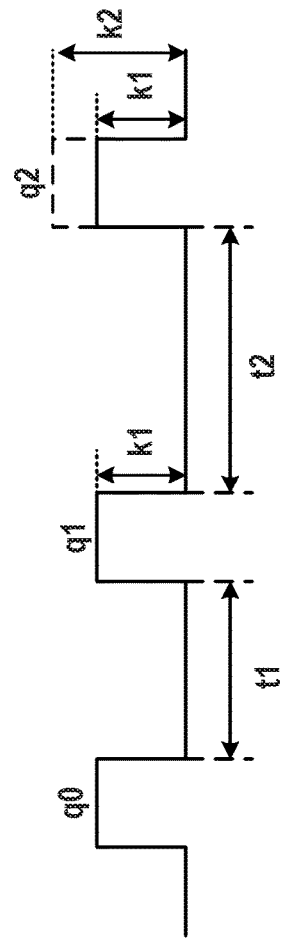
FIG. 5A
FIG. 5B

600

```
┌─────────────────────────────────────────────────────┐
│ PROVIDE A POWER SOURCE TO SUPPLY POWER TO A PULSED  │
│                      LASER DIODE                    │
│                         S602                        │
└─────────────────────────────────────────────────────┘
                            │
                            ▼
┌─────────────────────────────────────────────────────┐
│ PROVIDE A CAPACITOR CONNECTED TO A CATHODE OF THE   │
│                    PULSED LASER DIODE               │
│                         S604                        │
└─────────────────────────────────────────────────────┘
                            │
                            ▼
┌─────────────────────────────────────────────────────┐
│ CONTROL, BY A SWITCH CONNECTED TO THE CAPACITOR,    │
│ CHARGING AND DISCHARGING OF THE CAPACITOR BASED ON  │
│                   A CONTROL SIGNAL                  │
│                         S606                        │
└─────────────────────────────────────────────────────┘
                            │
                            ▼
┌─────────────────────────────────────────────────────┐
│              PERFORM AMPLITUDE CODING               │
│                         S608                        │
└─────────────────────────────────────────────────────┘
                            │
                            ▼
┌─────────────────────────────────────────────────────┐
│               PERFORM TEMPORAL CODING               │
│                         S610                        │
└─────────────────────────────────────────────────────┘
```

MULTI-PULSE GENERATION FOR PULSED LASER DIODES USING LOW-SIDE DRIVERS

CROSS-REFERENCE TO RELATED APPLICATIONS

The present application is a Continuation-In-Part (CIP) of U.S. patent application Ser. No. 16/231,823, filed Dec. 24, 2018, the entire contents of which are incorporated herein by reference.

TECHNICAL FIELD

The present disclosure relates to systems and methods for controlling pulsed laser diodes, and more particularly, to systems and methods for controlling pulsed laser diodes using low-side drivers for multi-pulse generation.

BACKGROUND

Pulsed laser diodes (PLDs) are widely used in three-dimensional (3D) sensing applications. For example, in a light detection and ranging (LiDAR) system, PLDs are utilized to generate pulsed laser beams, which are emitted by a scanner of the LiDAR system and reflected by surrounding objects. The reflected laser signals can be detected by a photodetector and used to determine range or distance information based on, for example, the round-trip travel time of the pulsed laser beams.

In current systems, PLDs are driven by drivers using a "high-side driven" approach. In this conventional approach, the anode of a PLD is connected to the high voltage supply, and the cathode of the PLD is connected to the ground through a switch. One drawback of this conventional approach is that the parasitic inductance, resistance, and capacitance can be significantly large to cause noticeable ringing effect. The ringing effect compromises the signal integrity and power efficiency, and can potentially reduce component lifetime. In addition, it is difficult to generate multiple pulses with varying amplitudes or time delays using a single pulsed laser diode driven by the conventional high-side driven drivers.

Embodiments of the disclosure address the above problems by an improved PLD driving system using a "low-side driven" architecture.

SUMMARY

Embodiments of the disclosure provide a system for controlling a pulsed laser diode. The system includes a power source configured to supply power to the pulsed laser diode and at least one driving branch between the power source and the pulsed laser diode. The at least one driving branch is configured to control power delivery from the power source to the pulsed laser diode. The at least one driving branch is connected to a cathode of the pulsed laser diode.

Embodiments of the disclosure also provide a method for controlling a pulsed laser diode. The method includes providing a power source to supply power to the pulsed laser diode. The method also includes controlling, by at least one driving branch between the power source and the pulsed laser diode, power delivery from the power source to the pulsed laser diode. The at least one driving branch is connected to a cathode of the pulsed laser diode.

Embodiments of the disclosure further provide a sensing device. The sensing device includes a pulsed laser diode and a power source configured to supply power to the pulsed laser diode. The sensing device also includes at least one driver coupled to the power source and the pulsed laser diode. The at least one driver is configured to deliver power from the power source to the pulsed laser diode to emit a pulsed laser beam. The at least one driver is connected to a cathode of the pulsed laser diode.

It is to be understood that both the foregoing general description and the following detailed description are exemplary and explanatory only and are not restrictive of the invention, as claimed.

BRIEF DESCRIPTION OF THE DRAWINGS

FIG. 5A illustrates a circuit diagram of another exemplary driving system, according to embodiments of the disclosure.

FIG. 5B illustrates a graph of an exemplary pulse train generated by the driving system of FIG. 5A, according to embodiments of the disclosure.

FIG. 6 illustrates a flowchart of an exemplary method for controlling a pulsed laser diode, according to embodiments of the disclosure.

DETAILED DESCRIPTION

Reference will now be made in detail to the exemplary embodiments, examples of which are illustrated in the accompanying drawings. Wherever possible, the same reference numbers will be used throughout the drawings to refer to the same or like parts.

Pulsed laser diodes (PLDs) are often used as light sources in three-dimensional (3D) sensing applications. A pulsed laser diode can be turned on for a short period of time, usually in the order of a few nanoseconds, to emit a pulsed laser beam, which travels along a substantially straight line until being reflected by an object. The reflected laser beam can be detected by a photodetector. The distance between the light source (e.g., pulsed laser diode) and the object reflecting the laser beam can be determined based on the round-trip travel time of the laser beam or the phase shift between the emitted and reflected laser beams, as the speed of light is constant. Because the angle of light emission is known, the spatial location of the object, or more precisely, the location of the reflection point on the object, can be determined. By emitting a large number of pulsed laser beams to the surrounding environment, a "point cloud" representing a 3D distribution of the reflection points can be constructed, from which a profile of an object, the spatial location of the object, or other spatial information can be determined.

Figure 7:
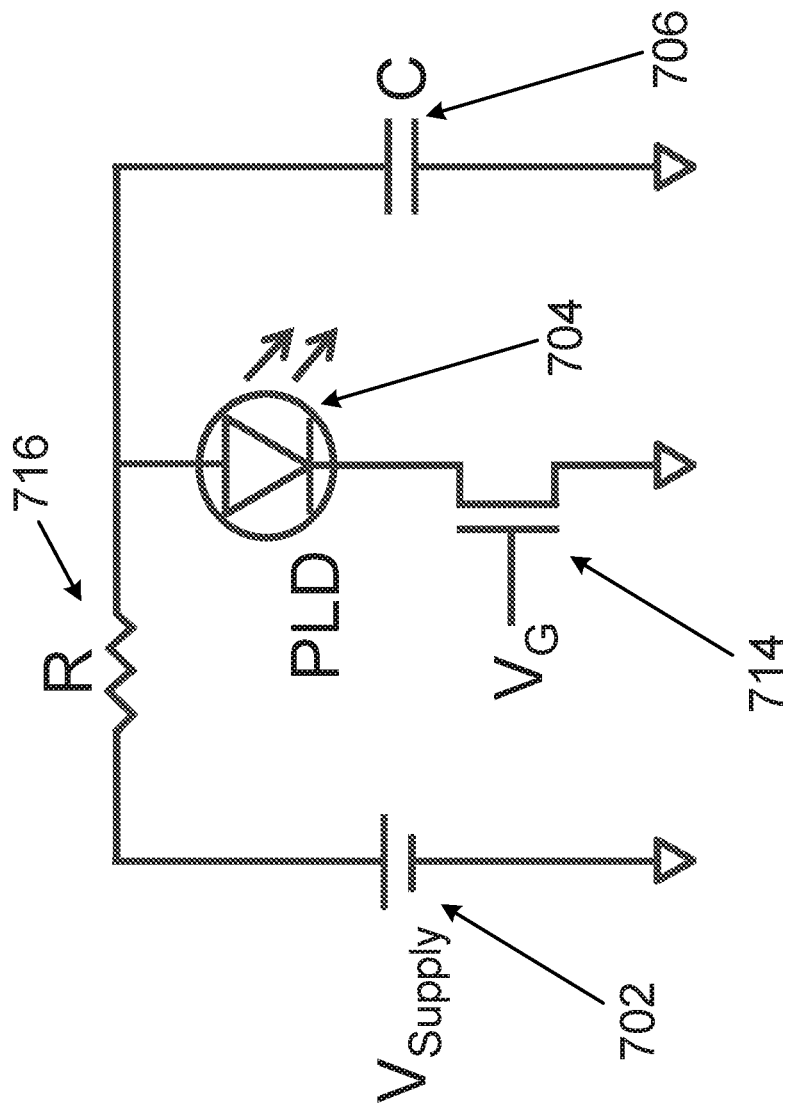
FIG. 7 illustrates a circuit diagram of a conventional "high-side driven" PLD driver.

To emit pulsed laser beams, a PLD needs to draw power from a power source. Power delivery from the power source to the PLD is normally controlled by a PLD driver (also referred to as "driver" for short). Conventionally, PLD drivers are implemented using a "high-side driven" approach. FIG. 7 shows an exemplary "high-side driven" driver 700 according to the conventional design approach. As shown in FIG. 7, driver 700 is implemented using a power supply 702, a capacitor 706, a switch 714, and a resistor 716 to drive a PLD 704. The anode of PLD 704 (high-voltage side) is connected to voltage supply 702 through resistor 716, and the cathode of PLD 704 is connected to the ground through switch 714. As discussed above, one drawback of this conventional approach is that the parasitic inductance, resistance, and capacitance on both sides of PLD 704 can be significant large to cause noticeable ringing effect, which compromises the signal integrity and power efficiency, and can potentially reduce component lifetime. In addition, it is difficult to generate multiple pulses with varying amplitudes or time delays using a single pulsed laser diode (e.g., PLD 704) driven by conventional high-side driven drivers.

Embodiments of the present disclosure provide an improved PLD driver implemented using a "low-side driven" architecture. In the low-side driven architecture, the anode of the PLD is connected to the ground, while the cathode of the PLD is connected closer to the high voltage supply. As will be discussed in greater detail below, this low-side driven architecture can reduce the parasitic resistance, inductance, and capacitance, thereby improving the signal integrity and power conversion efficiency. In addition, the low-side driven architecture enables signal coding (e.g., amplitude coding and temporal coding) for mitigation interference. Moreover, laser pulses of varying amplitudes can be emitted from a single PLD to improve the dynamic range of 3D sensing (e.g., LiDAR sensing). Finally, cost reduction can be significant because a single PLD driven by a low-side driven driver having multiple driving branches can implement functions that currently would require multiple PLDs with accompanying drivers.

In the following description, exemplary embodiments are disclosed in the context of a vehicle-mounted LiDAR application, in which a sensing device such as a LiDAR device mounted to a vehicle is operable to detect point clouds of the surround environment. It is contemplated that systems and methods for controlling power delivery to a pulsed laser diode disclosed herein are not limited to this particular application. Rather, the disclosed systems and methods are applicable to any 3D sensing applications, such as flash 3D sensing, structured light sensing, or any application using pulsed laser diodes for object sensing.

Figure 1:
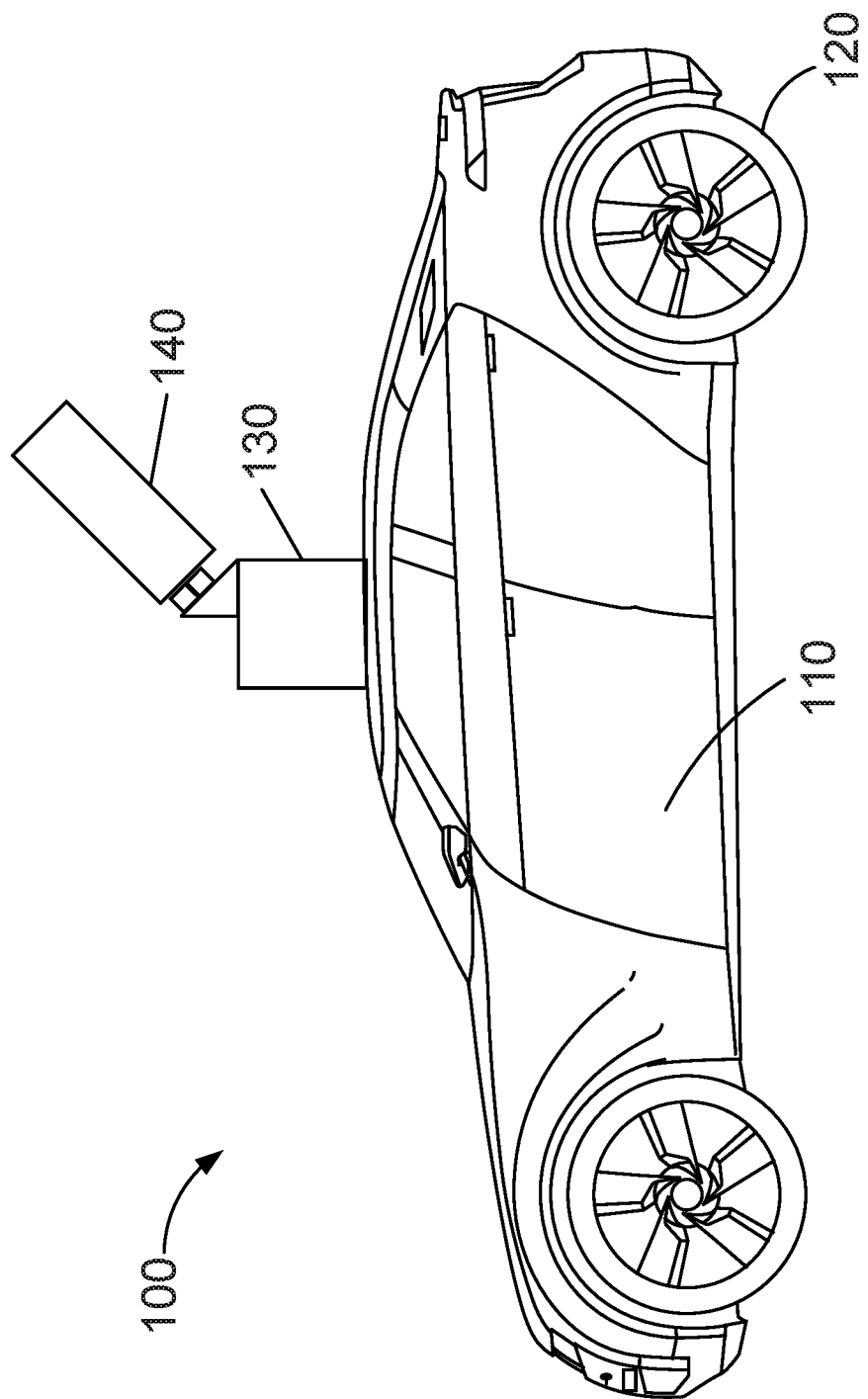
FIG. 1 illustrates a schematic diagram of an exemplary vehicle equipped with a sensing device, according to embodiments of the disclosure.

FIG. 1 illustrates a schematic diagram of an exemplary vehicle 100 equipped with a sensing device 140, according to embodiments of the disclosure. Consistent with some embodiments, vehicle 100 may be a survey vehicle configured to acquire data for constructing a high-resolution map or three-dimensional (3-D) city model. In some embodiments, vehicle 100 may be an autonomous driving vehicle using sensing device 140 to sense surrounding environment, road conditions, traffic conditions, pedestrian presence, or other information related to autonomous driving and/or navigation. It is contemplated that vehicle 100 may be an electric vehicle, a fuel cell vehicle, a hybrid vehicle, or a conventional internal combustion engine vehicle. Vehicle 100 may have a body 110 and at least one wheel 120. Body 110 may be of any body style, such as a sports vehicle, a coupe, a sedan, a pick-up truck, a station wagon, a sports utility vehicle (SUV), a minivan, or a conversion van. In some embodiments, vehicle 100 may include a pair of front wheels and a pair of rear wheels, as illustrated in FIG. 1. However, it is contemplated that vehicle 100 may have less wheels or equivalent structures that enable vehicle 100 to move around. Vehicle 100 may be configured to be all wheel drive (AWD), front wheel drive (FWR), or rear wheel drive (RWD). In some embodiments, vehicle 100 may be configured to be operated by an operator occupying the vehicle, remotely controlled, and/or autonomous.

As illustrated in FIG. 1, vehicle 100 may be equipped with sensing device 140 mounted to body 110 via a mounting structure 130. Mounting structure 130 may be an electromechanical device installed or otherwise attached to body 110 of vehicle 100. In some embodiments, mounting structure 130 may use screws, adhesives, or another mounting mechanism. It is contemplated that the manners in which sensing device 140 can be equipped on vehicle 100 are not limited by the example shown in FIG. 1. The equipping manners may be modified depending on the type of sensing device 140 and/or vehicle 100 to achieve desirable sensing performance.

In some embodiments, sensing device 140 may be configured to capture data as vehicle 100 moves along a trajectory. In some embodiments, sensing device 140 may be a LiDAR scanner/device configured to scan the surrounding and acquire point clouds. LiDAR measures distance to a target object by illuminating the target object with pulsed laser beams and measuring the reflected pulses with a photodetector. Differences in laser return times, phases, or wavelengths can then be used to calculate distance information (also referred to as "range information") and construct digital 3-D representations of the target object (e.g., a point cloud). The laser light used for LiDAR scan may be ultraviolet, visible, or near infrared. As vehicle 100 moves along the trajectory, sensing device 140 may acquire a series of point clouds at multiple time points, which may be used to construct a high definition map or facilitate autonomous driving.

FIGS. 2, 3, 4A-4B, and 5A-5B illustrate several circuit diagrams of exemplary systems for controlling a pulsed laser diode 202, according to some disclosed embodiments. Components shown in FIGS. 2, 3, 4A-4B, and 5A-5B may be integrated into sensing device 140 or may be distributed among several devices that coupled to each other through direct links or one or more networks.

Figure 2:
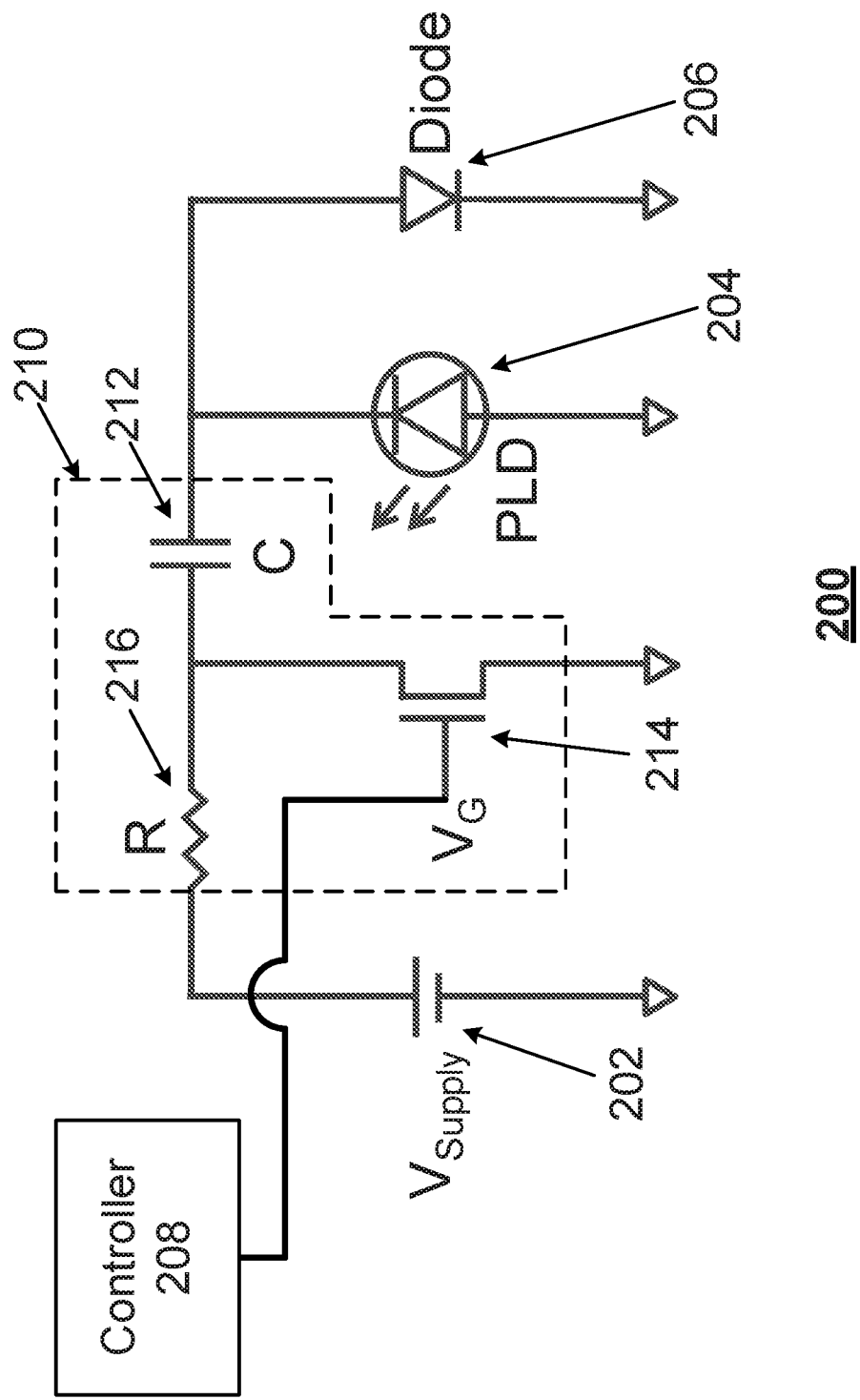
FIG. 2 illustrates a circuit diagram of an exemplary driving system using a "low-side driven" architecture, according to embodiments of the disclosure.

FIG. 2 illustrates a circuit diagram of an exemplary driving system 200 using a low-side driven architecture, according to embodiments of the disclosure. As shown in FIG. 2, a power source 202 may be provided to supply power to PLD 204. In some embodiments, power source 202 can be a voltage source with a fixed or variable voltage output. In some embodiments, the output voltage of power source 202 can be dynamically adjusted based on, for example, the distance between PLD 204 and an object reflecting the pulsed laser beams emitted by PLD 204.

Power source 202 may deliver power to PLD 204 through a driving branch 210 connected between power source 202 and PLD 204. Driving branch 210 may be configured to control power delivery from power source 202 to PLD 204. As shown in FIG. 2, driving branch 210 is connected to the cathode (the low-voltage side) of PLD 204, while the anode (the high-voltage side) of PLD 204 is connected directly to the ground. This low-side driven architecture can minimize parasitic inductance, resistance, and capacitance. For example, the trace connecting the anode of PLD 204 and the ground can be made very short.

Driving branch 210 may include a capacitor 212, a switch 214, and a resistor 216. Capacitor 212 may be connected to the cathode of PLD 204 and configured to temporarily store electrical energy received from power source 202 for driving PLD 204. Switch 214 may be connected to capacitor 212 and configured to control charging and discharging of capacitor 212 based on a control signal $V_G$ applied to control terminal of switch 214. Switch 214 may be implemented using any suitable switching devices such as metal-oxide-semiconductor field-effect transistors (MOSFETs), gallium nitride field-effect transistor (GaNFET), or the like. A diode 206 may be connected to PLD 204, where an anode of diode 206 can be connected to the cathode of PLD 204.

Control signal $V_G$ may be provided by a controller 208. Controller 208 may be implemented using any suitable microcontroller, microprocessor, field-programmable gate array (FPGA), or the like. Controller 208 may apply control signal $V_G$ to a control terminal of switch 214 (e.g., the gate terminal of a FET device) to turn on or off switch 214. When control signal $V_G$ turns off switch 214, power source 202 may charge capacitor 212 through resistor 216. Capacitor 212 may be fully or partially charged. When control signal $V_G$ turns on switch 214, capacitor 212 may be discharged. The electrical charges discharged from capacitor 212 may create a current flowing from the ground through PLD 204, thereby turning on and driving PLD 204 to emit a laser beam. For example, PLD 204 can convert the electrical energy to photo energy and emit the laser beam, the intensity of which depends on the level of electrical current flowing through PLD 204. After a short period of time (e.g., in the order of nanoseconds), switch 214 may be turned off, thereby also turning off PLD 204, completing the emission of a laser pulse.

Specifically, the electrical current flowing through PLD 204 during the turn-on period can be represented as follows:

$$I = \frac{C \cdot V}{Tp}. \qquad (1)$$

In equation (1), I is the electrical current flowing through PLD 204, C is the capacitance of capacitor 212, V is the voltage level of power source 202 (e.g., $V_{supply}$ in FIG. 2), and Tp is the pulse width or pulse period, normally in the order of a few nanosecond. The output power of PLD 204 (e.g., proportional to the intensity of the emitted laser beam) is proportional to current I.

In systems using the conventional high-side driven driving approach, each PLD can only output one kind of pulsed laser beam, with a fixed amplitude. In order to output laser pulses with varying amplitudes to perform signal coding, multiple PLDs, each driven by a dedicated driver, have to be used. The improved system disclosed herein can perform signal coding using a single PLD driven by multiple driving branches connected in parallel. In this way, the number of PLDs needed to perform signal coding can be significantly reduced, greatly lowering the cost of the PLD driving system.

Figure 3:
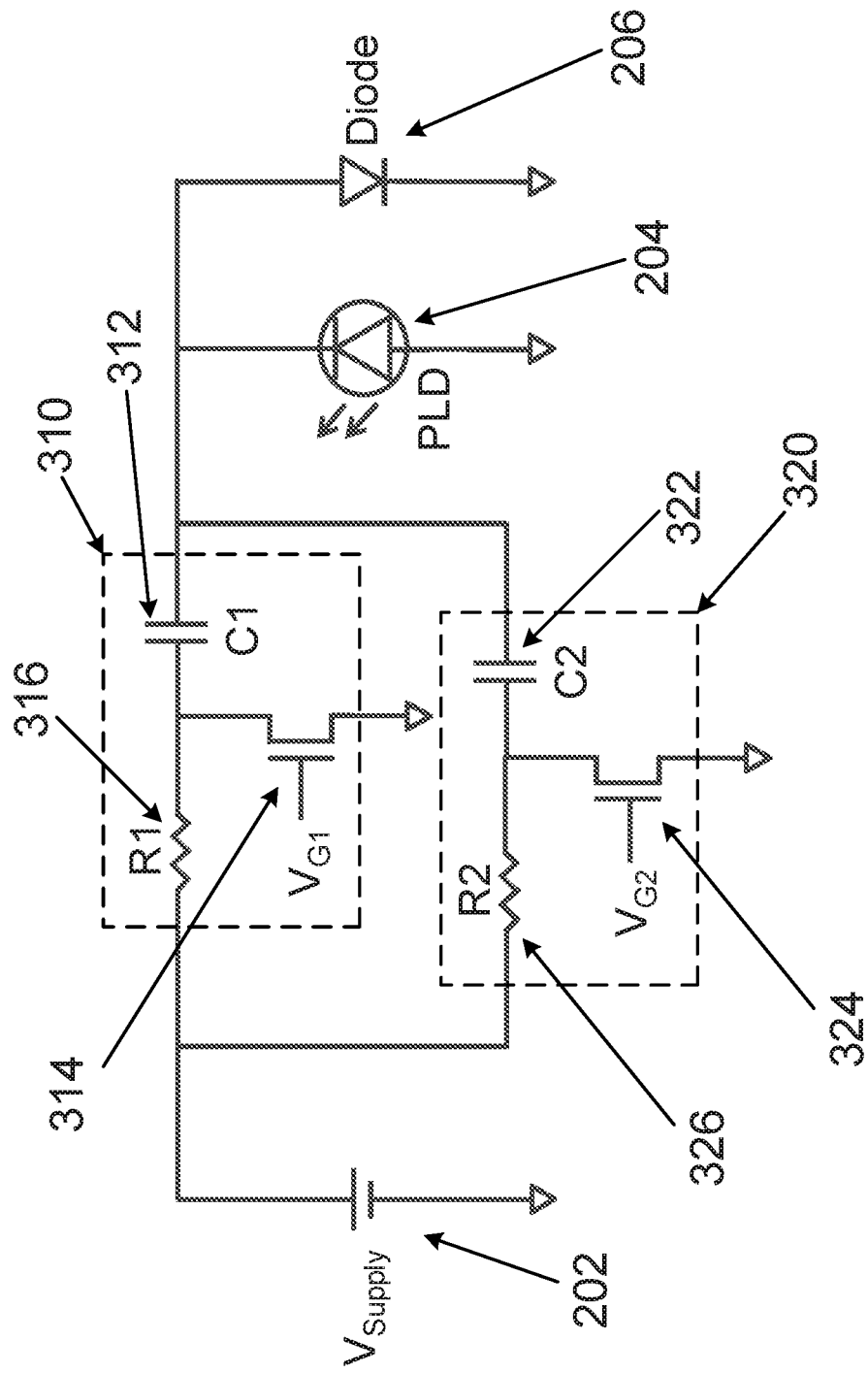
FIG. 3 illustrates a circuit diagram of another exemplary driving system having multiple driving branches, according to embodiments of the disclosure.

FIG. 3 illustrates a circuit diagram of an exemplary driving system 300 having multiple driving branches, according to embodiments of the disclosure. As shown in FIG. 3, system 300 includes two driving branches 310 and 320 connected in parallel between power source 202 and the cathode of PLD 204. Each driving branch 310 or 320 can individually control power delivery from power source 202 to PLD 204. For example, driving branch 310 includes a capacitor 312, a switch 314, and a resistor 316; driving branch 320 includes a capacitor 322, a switch 324, and a resistor 326. Each of switches 314 and 324 can be controlled by controller 208 (shown in FIG. 2) to individually turned on and off, causing discharging of the respective capacitor 312/322 to drive PLD 204. As a result, PLD 204 can emit a first pulse corresponding to driving current generated by driving branch 310 (e.g., due to the discharging of capacitor 312) and a second pulse corresponding to driving current generated by driving branch 320 (e.g., due to the discharging of capacitor 322). The first and second pulses can be nonoverlapping pulses (e.g., the turn-on time periods of the first and second pulses do not overlap with each other) or overlapping pulses (e.g., the turn-on time periods of the first and second pulses overlap with each other, thereby creating a partially combined pulse with the overlapping portions superimposed). Although FIG. 3 shows only two driving branches 310 and 320, more driving branches can be added in parallel to provide more individual control means to control power delivery to PLD 204.

Figure 4A:
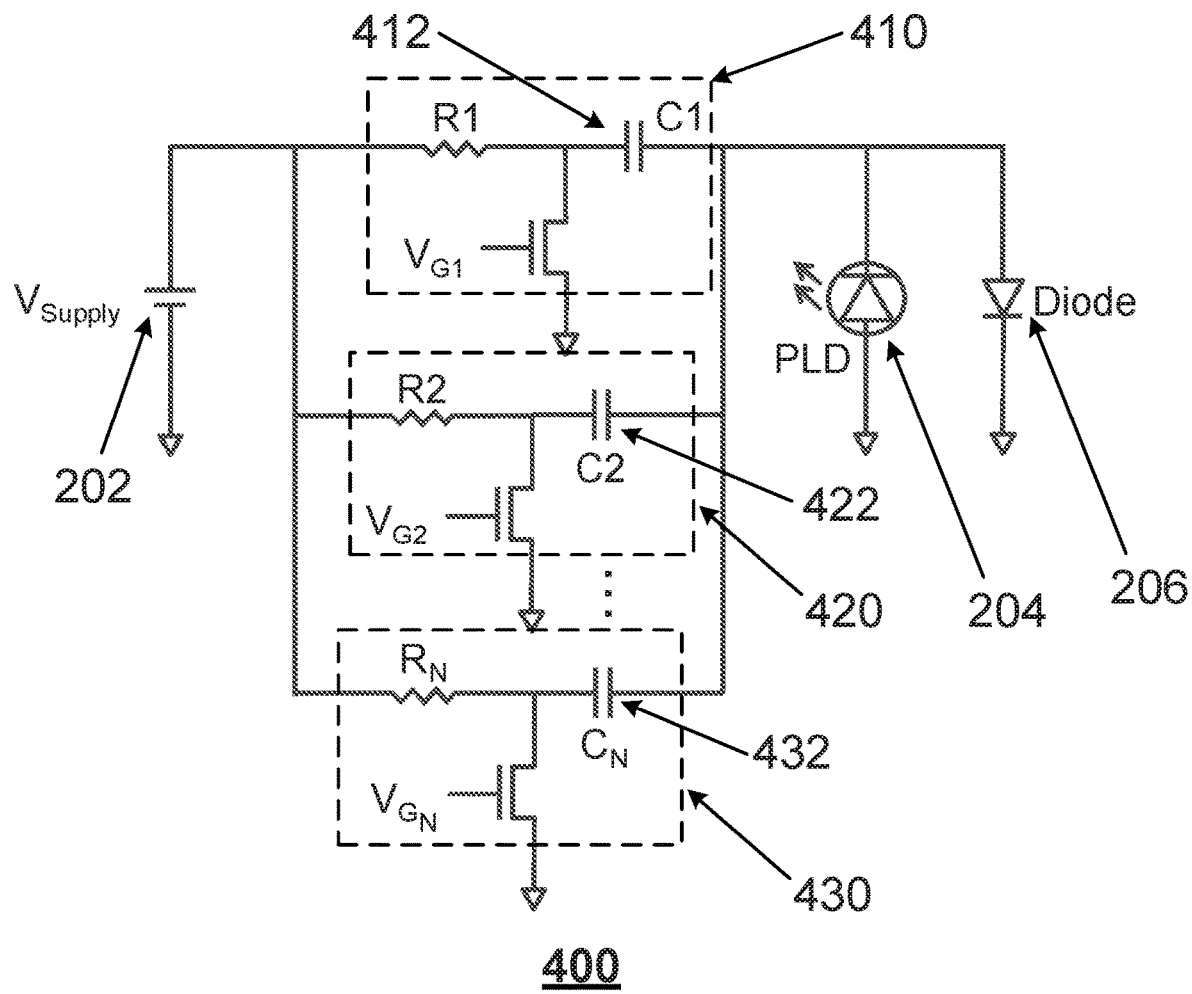
FIG. 4A illustrates a circuit diagram of another exemplary driving system, according to embodiments of the disclosure.
Figure 4B:
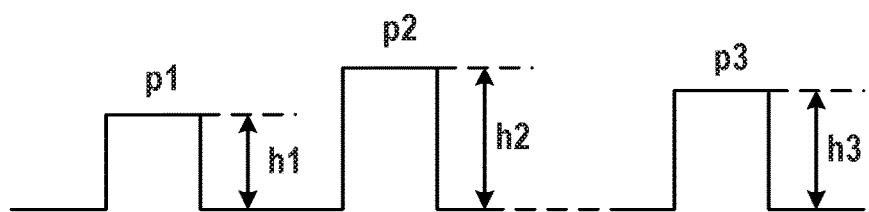
FIG. 4B illustrates a graph of an exemplary pulse train generated by the driving system of FIG. 4A, according to embodiments of the disclosure.

FIG. 4A illustrate a circuit diagram of another exemplary driving system 400, according to embodiments of the disclosure. Referring to FIG. 4, N parallel driving branches (410, 420, . . . , 430) are provided between power source 202 and PLD 204. Each of the driving branches may include a capacitor (e.g., 412, 422, . . . , 432). The capacitance of these capacitors can be the same as or different from each other. For example, capacitors 412, 422, and 432 may each have a different capacitance value. Based on equation (1), the capacitance is proportional to the current flowing through PLD 204, which in turn is proportional to the intensity of the laser beam emitted by PLD 204. FIG. 4B illustrate an exemplary pulse train generated by PLD 204 driven by driving system 400. In FIG. 4B, the amplitude (also referred to as height) (h1, h2, . . . , h3) of each respective pulse (p1, p2, . . . , p3) is used to indicate the intensity of each pulse. Assume that p1 is the pulse generated by PLD 204 driven by driving branch 410, p2 is the pulse generated by PLD 204 driven by driving branch 420, . . . , and p3 is the pulse generated by PLD 204 driven by driving branch 430, then the amplitudes of these pulses (h1, h2, . . . , h3) can be controlled by using capacitors having specific capacitance values (or relative values). In some embodiments, the capacitance of the capacitor of a particular driving branch can be predetermined based on design requirements. Different driving branches may use capacitors having different capacitance values to create pulses have varying amplitudes. In some embodiments, the capacitance of one or more driving branches can be dynamically adjusted, for example based on distance information fed back from a distance detector. In any case, pulses having varying amplitudes can be generated by driving a single PLD 204 using multiple parallel connected driving branches connected to the PLD in a low-side driven manner.

The amplitude of a laser pulse can also be controlled by the power rating of the switch in a driving branch. For example, a higher rating switch may allow a larger amount of current to flow through PLD 204 compared to a lower rating switch. Similarly, the resistance value of the resistor in a driving branch may also affect the current flowing through PLD 204, thereby controlling the amplitude of the laser pulse emitted by PLD 204. In addition to the power rating of the switch and the resistance in the driving branch, the amplitude of the laser pulse can also be controlled by adjusting the voltage level of the control signal $V_G$ for each individual driving branch. For example, even if two driving branches have identical components, the control signal $V_G$ applied to the switch in each driving branch can control how much current can pass through the switch in each driving branch individually and independently, thereby controlling the amplitude of the laser pulse. The voltage of power source 202 may also affect the current flowing through PLD 204, based on equation (1), although the voltage may affect all driving branches rather than a single driving branch. Systems and methods of controlling the voltage of power source 202 are disclosed in U.S. patent application Ser. No. 16/231,823, filed Dec. 24, 2018, to which the present application claims the benefit of priority and incorporates its entire contents by reference. All these different ways of varying the amplitude of a laser pulse emitted by PLD 204 can also be combined for any individual driving branch.

Amplitude coding can be performed using driving system 400. For example, controller 208 (shown in FIG. 2) may generate control signals (e.g., a sweep across the multiple driving branches in a particular order such as $V_{G1}$, $V_{G2}, \ldots V_{GN}$) that sequentially turn on the multiple driving branches to drive PLD 204. Because each driving branch may correspond to a particular amplitude (using any amplitude control method disclosed herein), a sequence of pulses (also referred to as a pulse train) having varying amplitudes may be generated. In this way, a pulse train can be amplitude encoded to, for example, identify the PLD/sensing device emitting the pulse train or distinguish the pulse train emitted by a particular PLD/sensing device from those emitted by other PLDs/sensing devices. Amplitude coding may mitigate signal interference (e.g., mixture of signals from different sensing devices) and improve sensing performance and efficiency.

FIG. 5A illustrate a circuit diagram of another exemplary driving system 500, according to embodiments of the disclosure. Referring to FIG. 5A, driving system 500 includes two driving branches 510 and 520, each including a delay circuit (518, 528). Delay circuit 518/528 may be configured to delay emission of a laser pulse emitted by PLD 204 driven by its respective driving branch 510/520 by adding a time delay to control signal $V_{G1}/V_{G2}$ that turns on the respective switch. Delay circuit 518/528 can be implemented by, for example, an R/C delay circuit, a delay line IC, a chain of logic gates such as inverters, etc. The delay time can be controlled by preset parameters (e.g., resistance and capacitance of an R/C delay circuit) or dynamically adjusted (e.g., a programmable IC). Delay circuit 518/528 may shift an individual pulse in time by the amount of the delay time. FIG. 5B illustrate an exemplary pulse train subject to varying time delays. Referring to FIG. 5B, q0 may be a reference pulse indicating the starting point of applying delays. After q0, a controllable sequence of delays may be applied to shift pulses q1 and q2, corresponding to the pulse generated by PLD 204 driven by driving branches 510 and 520, respectively, by a controllable time period. The resulting time difference between q1 and q0 may be denoted by t1, and the resulting time different between q2 and q1 may be denoted by t2, as shown in FIG. 5B. The time differences between adjacent pulses may be used to perform temporal coding, where PLD 204 is driven sequentially by multiple driving branches to emit laser pulses having varying time delays between adjacent pulses. Similar to amplitude coding, temporal coding may also be used to mitigate signal interference by distinguish pulse trains generated by a particular sensing device from pulse trains generated by other sensing devices.

Amplitude coding and temporal coding may also be combined. For example, amplitude coding may be implemented on top of driving system 500 by setting the capacitance of capacitor 512 and 522 to appropriate values. As a result, the amplitude of pulse q2 can be changed to k2, different from the amplitude k1 of pulse q1. In addition to or instead of setting the capacitance values, any method of controlling the amplitude of laser pulses emitted by PLD 204 disclosed herein can be used to perform amplitude coding based on driving system 500. Similarly, one or more delay circuits can be added to driving system 400 to implement both amplitude coding and temporal coding.

In some embodiments, driving systems disclosed herein may be used to optimize the dynamic range responses of a LiDAR system. For example, certain driving branches may use smaller capacitors configured to generate pulses with lower intensity, which may be used for sensing objects located relatively closer to the LiDAR system or with relatively higher reflectivity. Certain driving branches may use larger capacitors configured to generate pulses with higher intensity, which may be used for sensing objects located relatively farther away from the LiDAR system or with relatively lower reflectivity. During operation, a pilot laser beam may be used to detect the range/distance between the object and the LiDAR system. Systems and methods for detecting the range/distance between the object and the LiDAR system are disclosed in U.S. patent application Ser. No. 16/231,823, filed Dec. 24, 2018, to which the present application claims the benefit of priority and incorporates its entire contents by reference. Based on the range/distance information, the LiDAR system may dynamically select the appropriate driving branch(es) to drive the PLD to emit laser beams having the optimal intensity for 3-D sensing according to the range/distance.

FIG. 6 illustrates a flowchart of an exemplary method 600 for controlling a pulsed laser diode, according to embodiments of the disclosure. Method 600 may be implemented by driving systems 200, 300, 400, and/or 500 in FIGS. 2, 3, 4A, and 5A, respectively. However, method 600 is not limited to that exemplary embodiment. Method 600 may include steps S602-S610 as described below. It is to be appreciated that some of the steps may be optional to perform the disclosure provided herein. Further, some of the steps may be performed simultaneously, or in a different order than shown in FIG. 6.

In step S602, a power source (e.g., power source 202) may be provided to supply power to a PLD (e.g., PLD 204). Power source 202 may connect to PLD 204 though a driving branch 210 that controls power delivery from power source 202 to PLD 204.

In step S604, a capacitor (e.g., capacitor 212) may be provided to connect to a cathode of PLD 204. Capacitor 212 may be part of driving branch 210 and may be configured to temporarily store electrical energy received from power source 202 for driving PLD 204.

In step S606, a switch (e.g., switch 214) may control charging and discharging of capacitor 212 based on a control signal (e.g., $V_G$) provided by controller 208. For example, when control signal $V_G$ turns off switch 214, capacitor 212 may be charged by power source 202. When control signal $V_G$ turns on switch 214, capacitor 212 may be discharged. Electrical charges discharged from capacitor 212 may drive PLD 204 to emit a laser pulse.

In step S608, a driving system (e.g., driving system 400) having multiple driving branches connected in parallel (e.g., driving branches 410, 420, . . . , 430) may perform amplitude coding. For example, each driving branch may individually control power delivery from power source 202 to PLD 204 and each driving branch may have a capacitor having a particular capacitance that is proportional to the current flowing though PLD 204, which is in turn proportional to the intensity of the laser pulse emitted by PLD 204. By controlling the capacitance values of multiple driving branches, pulses having varying amplitudes can be generated by PLD 204. The controllable variation of amplitudes is a form of amplitude coding.

In step S610, a driving system (e.g., driving system 500) having multiple driving branches connected in parallel (e.g., driving branches 510, 520) may perform temporal coding. For example, each driving branch may individually control power delivery from power source 202 to PLD 204 and at least one driving branch may have a delay circuit to generate a time delay to delay the emission of a laser pulse. By controlling the time delays between adjacent pulses, temporal coding may be achieved.

Another aspect of the disclosure is directed to a sensing device that includes a pulsed laser diode (e.g., 202) and one or more components of the control system disclosed herein. For example, the sensing device may include pulsed laser diode 202, distance detector 214, and any one of any combination of the various controllers disclosed herein.

A further aspect of the disclosure is directed to a non-transitory computer-readable medium storing instructions which, when executed, cause one or more processors to perform the methods disclosed herein. The computer-readable medium may be volatile or non-volatile, magnetic, semiconductor-based, tape-based, optical, removable, non-removable, or other types of computer-readable medium or computer-readable storage devices. For example, the computer-readable medium may be the storage device or the memory module having the computer instructions stored thereon, as disclosed. In some embodiments, the computer-readable medium may be a disc or a flash drive having the computer instructions stored thereon.

It will be apparent to those skilled in the art that various modifications and variations can be made to the disclosed system and related methods. Other embodiments will be apparent to those skilled in the art from consideration of the specification and practice of the disclosed system and related methods.

It is intended that the specification and examples be considered as exemplary only, with a true scope being indicated by the following claims and their equivalents.

The invention claimed is:

1. A system for controlling a pulsed laser diode, the system comprising:
   a power source configured to supply power to the pulsed laser diode; and
   at least one driving branch between the power source and the pulsed laser diode, wherein:
   the at least one driving branch is configured to control power delivery from the power source to the pulsed laser diode;
   the at least one driving branch is connected to a cathode of the pulsed laser diode; and
   the at least one driving branch comprises a plurality of driving branches connected in parallel between the power source and the cathode of the pulsed laser diode, wherein each of the plurality of driving branches is configured to individually control power delivery from the power source to the pulsed laser diode.

2. The system of claim 1, wherein the driving branch comprises:
   a capacitor connected to the cathode of the pulsed laser diode and configured to temporarily store electrical energy received from the power source for driving the pulsed laser diode; and
   a switch connected to the capacitor and configured to control charging and discharging of the capacitor based on a control signal.

3. The system of claim 2, wherein the control signal is provided by a controller and the switch is configured to turned on or off by the control signal, wherein:
   when the control signal turns off the switch, the capacitor is charged by the power source; and
   when the control signal turns on the switch, the capacitor is discharged, wherein electrical charges discharged from the capacitor drive the pulsed laser diode to emit a laser pulse.

4. The system of claim 1, wherein:
   the plurality of driving branches comprise first and second driving branches;
   the first driving branch comprises a first switch and a first capacitor having a first capacitance; and
   the second driving branch comprises a second switch and a second capacitor having a second capacitance that is different from the first capacitance.

5. The system of claim 4, wherein:
   the first and second switches are configured to control discharging of the first and second capacitors, respectively, to drive the pulsed laser diode; and
   the pulsed laser diode, when driven by electrical charges discharged from the first and second capacitors, emits first and second laser pulses, respectively,
   wherein the first and second laser pulses have different amplitudes.

6. The system of claim 5, wherein the plurality of driving branches are configured to perform amplitude coding by driving the pulsed laser diode to emit laser pulses having varying amplitudes.

7. The system of claim 1, wherein:
   the plurality of driving branches comprise first and second driving branches; and
   at least one of the first or second driving branches comprises a delay circuit configured to delay emission of a laser pulse emitted by the pulsed laser diode driven by a respective first or second driving branch.

8. The system of claim 7, wherein the plurality of driving branches are configured to perform temporal coding by driving the pulsed laser diode to emit laser pulses having varying time delays.

9. The system of claim 1, comprising a diode connected to the pulsed laser diode, wherein an anode of the diode is connected to the cathode of the pulsed laser diode.

10. A method for controlling a pulsed laser diode, comprising:
    providing a power source to supply power to the pulsed laser diode;
    controlling, by at least one driving branch between the power source and the pulsed laser diode, power delivery from the power source to the pulsed laser diode, wherein the at least one driving branch is connected to a cathode of the pulsed laser diode; and
    providing a plurality of driving branches connected in parallel between the power source and the cathode of the pulsed laser diode, each of the plurality of driving branches individually controlling power delivery from the power source to the pulsed laser diode.

11. The method of claim 10, comprising:
    providing a capacitor connected to the cathode of the pulsed laser diode to temporarily store electrical energy received from the power source for driving the pulsed laser diode; and controlling, by a switch connected to the capacitor, charging and discharging of the capacitor based on a control signal.

12. The method of claim 11, comprising:
providing, by a controller, the control signal to turn on or off the switch, wherein:
- when the control signal turns off the switch, the capacitor is charged by the power source; and
- when the control signal turns on the switch, the capacitor is discharged, wherein electrical charges discharged from the capacitor drive the pulsed laser diode to emit a laser pulse.

13. The method of claim 10, wherein the plurality of driving branches comprise first and second driving branches and the method comprises:
controlling discharging of first and second capacitors of the first and second driving branches, respectively, to drive the pulsed laser diode, wherein the first and second capacitors have different capacitance,
wherein the pulsed laser diode, when driven by electrical charges discharged from the first and second capacitors, emits first and second laser pulses, respectively, the first and second laser pulses having different amplitudes.

14. The method of claim 13, comprising:
performing, using the plurality of driving branches, amplitude coding by driving the pulsed laser diode to emit laser pulses having varying amplitudes.

15. The method of claim 10, wherein the plurality of driving branches comprise first and second driving branches and the method comprises:
delaying, by a delay circuit of the first or second driving branch, emission of a laser pulse emitted by the pulsed laser diode driven by a respective first or second driving branch.

16. The method of claim 15, comprising:
performing, by the plurality of driving branches, temporal coding by driving the pulsed laser diode to emit laser pulses having varying time delays.

17. A sensing device, comprising:
a pulsed laser diode;
a power source configured to supply power to the pulsed laser diode; and
at least one driver coupled to the power source and the pulsed laser diode and configured to deliver power from the power source to the pulsed laser diode to emit a pulsed laser beam, wherein the at least one driver is connected to a cathode of the pulsed laser diode;
wherein:
- the at least one driver comprises a plurality of driving branches each configured to individually control power delivery from the power source to the pulsed laser diode; and
- the plurality of driving branches are configured to perform at least one of amplitude coding or temporal coding to the pulsed laser beam.

* * * * *